United States Patent [19]
Jenness

[11] 4,151,444
[45] Apr. 24, 1979

[54] VOLTAGE SWITCHING CIRCUIT FOR A COLOR DISPLAY SYSTEM

[75] Inventor: Timothy A. Jenness, Portland, Oreg.

[73] Assignee: Tektronix, Inc., Beaverton, Oreg.

[21] Appl. No.: 863,974

[22] Filed: Dec. 23, 1977

[51] Int. Cl.² .............................................. H01J 29/80
[52] U.S. Cl. ...................................... 315/1; 315/376; 358/73
[58] Field of Search ........................... 315/1, 375, 376; 358/72, 73

[56] References Cited

U.S. PATENT DOCUMENTS

| | | |
|---|---|---|
| 3,697,880 | 10/1972 | Melchior et al. ................... 358/72 X |
| 3,887,838 | 6/1975 | Thurston .............................. 315/376 |
| 4,092,566 | 5/1978 | Chambers et al. ................ 358/73 X |

*Primary Examiner*—Eugene R. LaRoche
*Attorney, Agent, or Firm*—Adrian J. LaRue; Thomas J. Spence

[57] ABSTRACT

A power supply for a color display device of the type in which the color of light emitted by a phosphor screen is changed by switching an electron accelerating voltage between different levels, the switching being digitally controlled and being connected so that descending voltage changes are recycled to efficiently drive the supply.

3 Claims, 10 Drawing Figures

VOLTAGE SWITCHING CIRCUIT FOR A COLOR DISPLAY SYSTEM

BACKGROUND OF THE INVENTION

As is well known, any instrument which uses a cathode-ray tube, such as the oscilloscope, requires direct current operating voltages much higher than the direct current potentials usually derived from conventional alternating current line voltages. These high voltages cannot be efficiently and economically attained for a plurality of reasons such as having to incorporate heavily insulated transformer windings, bulky and dangerous capacitors and other objectionable features. In addition, when the cathode-ray tube is a beam penetration type cathode-ray tube wherein the color of light emitted by a phosphor screen is changed by switching an electron accelerating voltage between different levels for a color display system the devariation of the necessary high voltages is even more particular. For example cost, reliability, switching speed and the above-mentioned efficiency must be considered.

Heretofore, voltage switching circuits in a color display system of this type in which the color of light emitted by a phosphor screen is changed by switching an electron accelerating voltage between different levels have included two or more silicon controlled rectifiers (SCR's) which are alternately triggered to switch the acclerating voltage between two different levels. As described in U.S. Pat. No. 3,512,036 which teaches a protective circuit for use with SCR high voltage switching circuits, such circuits connect the SCR's so that both SCR's could conduct simultaneously due to some malfunction. In such a case, the switching is latched-up in which neither of the SCR's can be turned off unless the current is interrupted. Therefore, the use of such a switching circuit along with a protection circuit as described in the above-mentioned patent becomes expensive.

In other prior art power supplies, especially where voltages are in the kilovolt ranges, switching of various voltages is usually difficult in that a plurality of relays, or precautions taken to adequately insulate switches and wiring must be undertaken, are utilized. With relays and switches, switching speeds of up to 200 microseconds are necessary to switch the accelerating voltages between different levels in order to change the color of the light emitted by the cathode-ray tube. These long switching times are not effective in state of the art equipment, another disadvantage of the prior art. Also, these prior art power supplies usually employ transistor "stacks" to do their high voltage switching which magnifies control interface due to the operating voltages of the transistor "stacks". Further, these transistor "stacks" are succeptable to breakdown thereby decreasing reliability.

SUMMARY OF THE INVENTION

The present invention overcomes these mentioned disadvantages of the prior art by providing a voltage switching circuit wherein all driver transistors operate at low voltages which simplifies the control interface which also means less transistors, hence less cost; since the transistors are operated at low voltages there will be less breakdown thereof which increases reliability; during descending voltage changes, the energy delivered to the cathode-ray tube is recycled back into the supply to conserve energy; and the circuit uses simple digital control and sequencing to increase switching speeds.

Basically, the entire voltage switching circuit consists of two series connected power supplies; a conventional-floating high voltage supply, and a switching supply which includes a high speed driver for loading energy into the load, a low impedance driver for maintaining the energy in the load and a digitally controlled reset which recycles the energy back into the driver supply.

It is therefore an object of the present invention to provide a voltage switching circuit for a color display system which overcomes the disadvantages of the prior art.

It is another object of the present invention to provide an improved power supply for a color display system of the type in which the color of the light emitted by a phosphor screen is changed by switching an electron accelerating voltage between different levels.

It is still another object of the present invention to provide an improved power supply for a color display system whereby switching is digitally controlled and being connected so that energy on descending voltage changes is recycled to efficiently drive the supply.

The foregoing and numerous other objects, advantages, and inherent functions of the present invention will become apparent as the same is more fully understood from the following description and drawings which describes the invention in one of its preferred embodiments; it is to be understood, however, that the embodiment described is not intending to be limiting nor exhausting of the invention but is given for the purpose of illustration in order that others skilled in the art may fully understand the invention and principles thereof and the manner of applying it in practical use so that they may modify it in various forms, each as may be best suited to the conditions of the particular use.

DESCRIPTION OF THE INVENTION

Figure 1:
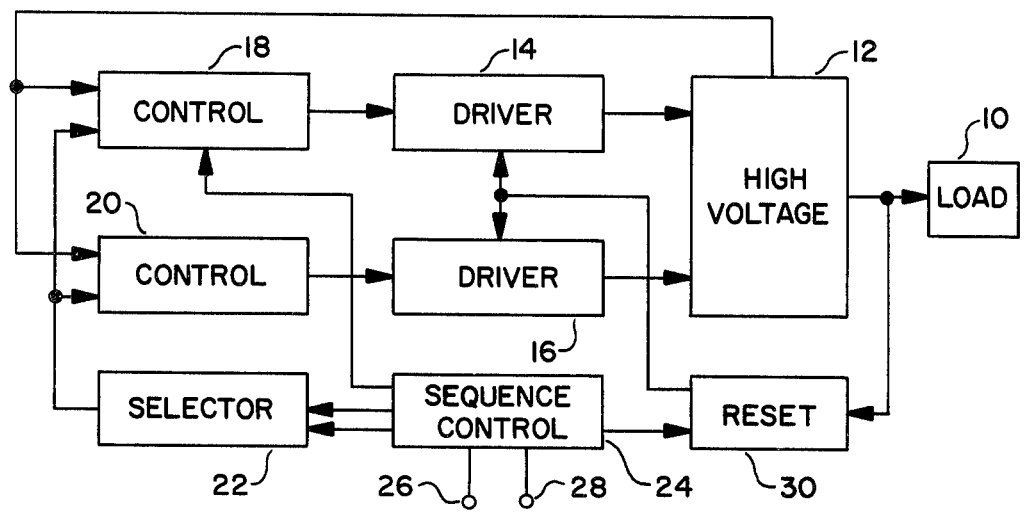
FIG. 1 is a block diagram of the voltage switching circuit for a color display system in accordance with the present invention.

Referring now to the drawings and in particular FIG. 1, there is indicated a load 10 such as a cathode-ray tube of a type with which the present invention is useful. Positive direct current is supplied to load 10 from a high voltage supply stage 12 which, in turn, is under the control of a first driving stage 14 and a second driving stage 16. These driving stages are urged into operation by first and second driver control means 18 and 20, respectively. Each of the driver control means includes first inputs which, in turn, are connected to each other and to the high voltage supply stage 12 for feedback purposes as well as having second inputs which, in turn, are connected to each other and to a selector stage 22. Selector stage 22 provides selectable reference signals necessary to drive the control and driver stages so that voltage stage 12 provides a certain magnitude of direct current voltage relative thereto. Selector stage 22 is digitally controlled by two signals obtained from a sequence control stage 24 which receives at inputs 26 and 28 coded information as to the necessary value of the reference signal discussed above. Sequence control stage 24 additionally provides an enable signal to first driver control means 18 as well as a signal to initiate a reset of the supply via a reset stage 30 operatively disposed between the output of the high voltage supply stage 12 and the first and second driving stages 14 and 16.

The FIG. 1 embodiment therefore represents a circuit which can best be described as consisting of two series connected power supplies. The first is high voltage supply stage 12 which is adapted to provide load 10 the lowest output level deliverable thereby. The second supply is, of course, the switching section supply as previously mentioned in the specification. In essence, first driving stage 14 is a circuit for loading energy into load 10 and is operated so that the energy is deliverable thereby to the load only during a certain time period, second driving stage 16 maintains the voltage on the load after being loaded by driver 14 at a frequency equal to the resonance of the transformer and finally the section which unloads energy off of load 10 during descending voltage changes and recycles it back to both the first and second driving stages in accordance with timing and common signals needed to satisfy the coded information applied at inputs 26 and 28.

To fully understand the invention, reference should now be directed to the drawings shown in FIGS. 2-9. In these drawings, a preferred circuit is shown and each figure corresponds to a particular block as shown in FIG. 1. It should be mentioned that the circuits shown and described thereinafter are not intended to be limiting thereto. An exception to this is the stage shown in FIG. 2 for conditioning the coded information for application to the sequence control stage 24 and which consists of a pair of inverting amplifiers comprising NPN transistors 50 and 52 whose emitters are grounded and whose collectors are coupled to a low voltage source of potential A, say positive 15 volts, via load resistors 66 and 68. The base of each transistor is biased to a selected level by biasing networks comprising resistor pairs 54-56 and 58-60, each pair serially connected between ground and another source of low voltage potential B, say negative 15 volts. In addition to being connected between the bias resistors, the base of each transistor is coupled to the input terminals 26 and 28 via input resistors 62 and 64 respectively.

Figure 2:
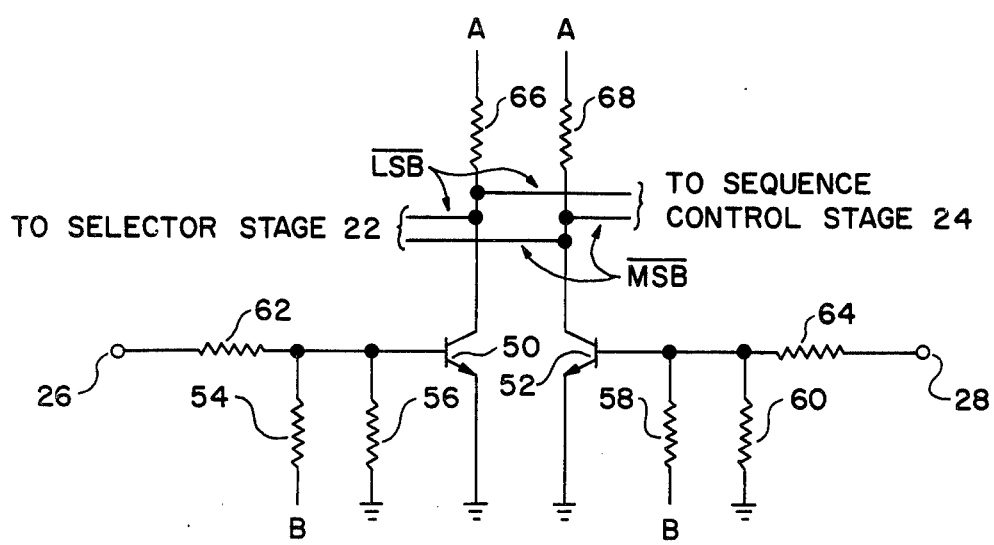
FIG. 2 is a schematic diagram of a typical circuit for conditioning coded information for application to the switching circuit shown in FIG. 1.
Figure 3:
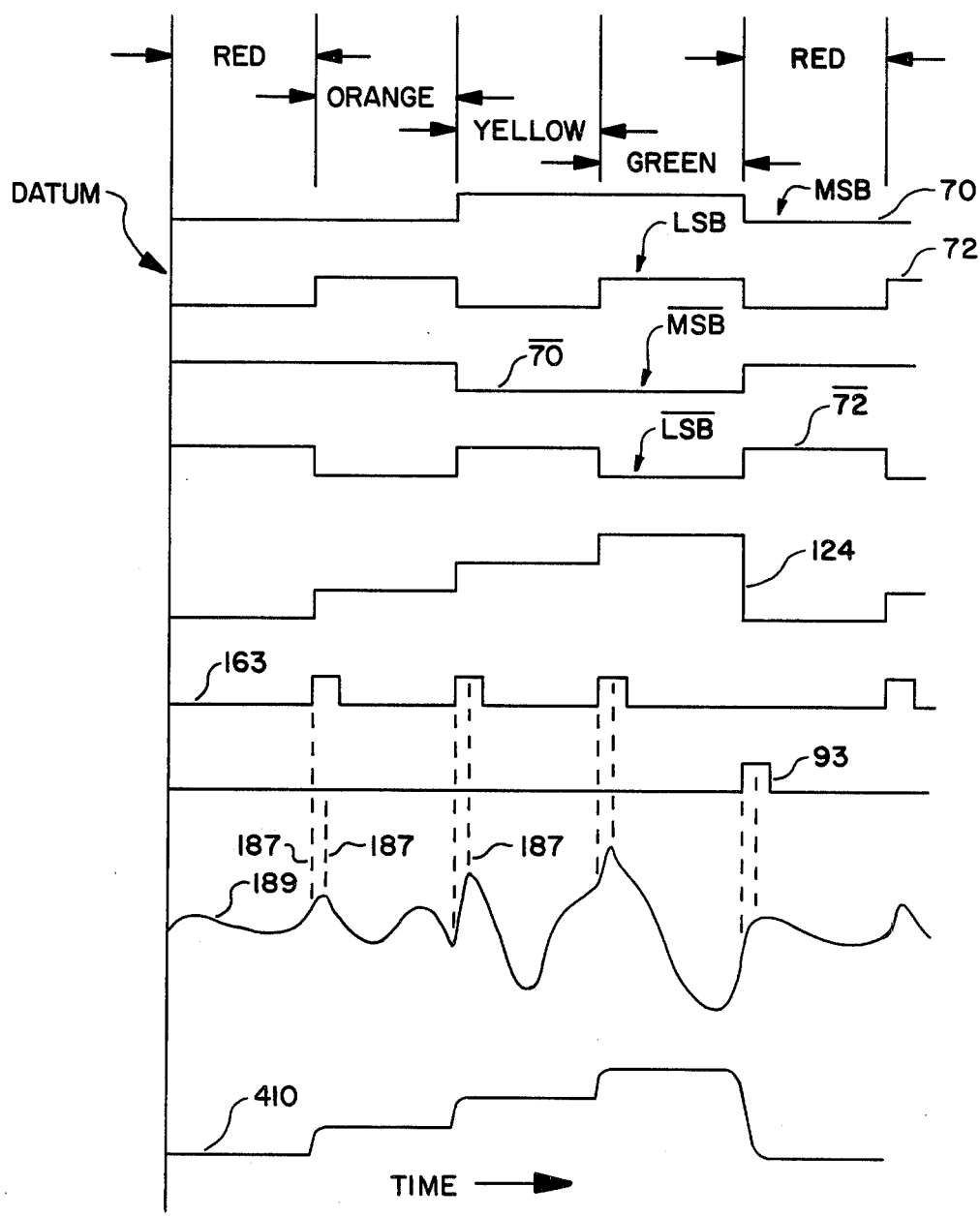
FIG. 3 is a graph of various waveforms helpfull in explaining the operation of the switching circuit shown in FIG. 1.

As was previously explained, each input terminal may receive coded information. Typical of such coded information are the waveforms 70 and 72 as shown in FIG. 3. Waveform 70 is a TTL compatible digital signal having two stable levels existing, for example, say at +5 volts and at zero volts i.e., a logical 1 and a logical 0 by definition; waveform 72 is similar. Assuming that the load 10 is a cathode-ray tube and further assuming that two phosphors are utilized therein, for example red and green phosphors, then waveform 70 and 72 represent coded information which will cause the power supply to switch the electron accelerating voltage between different levels to change the color of light emitted by the phosphor screen to thereby provide red light, green light or combinations thereof such as orange and yellow light. Digitally, if waveform 70 is considered as the most significant bit (MSB) and waveform 72 as the least significant bit (LSB), then as shown in the drawings and by definition red=00, orange=01, yellow=10 and green=11. In the circuit of FIG. 2, the MSB signal is applied to input 28 and the LSB signal is applied to input 26 whereby they are inverted by the amplifiers and are available in inverted and level shifted form, waveforms $\overline{70}$ and $\overline{72}$ (pronounced not 70, not 72), to be utilized by the sequence control stage 24 and the selector stage 22. It should be mentioned that hereinafter the waveforms 70, 72, $\overline{70}$ and $\overline{72}$ will be referred to as the MSB and LSB signals or $\overline{MSB}$ and $\overline{LSB}$ (inverted) signals, respectively.

Figure 4:
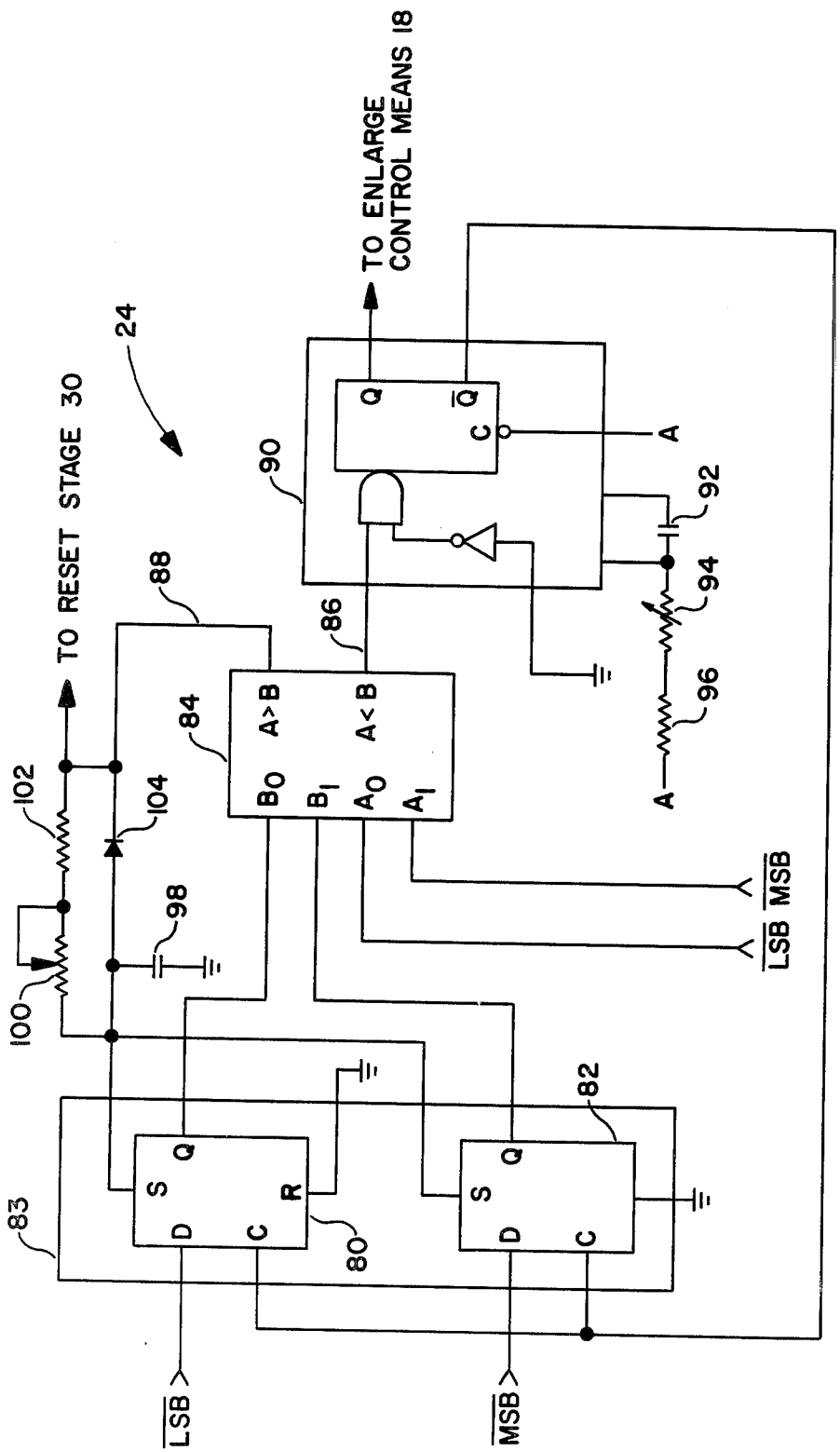
FIG. 4 is a circuit diagram of a circuit useful as the sequence control stage of the switching circuit shown in FIG. 1.

Referring now to FIG. 4 there is shown a schematic diagram of the sequence control stage 24. The $\overline{LSB}$ and $\overline{MSB}$ signals are respectively applied to D inputs of flip-flops 80 and 82 whose reset inputs R are grounded. The set inputs (S) of each D flip-flop are coupled together as are the clock inputs (C). Flip-flop 80 and 82 are preferably the MC14013B dual type D flip-flop device (indicated by solid box 83 surrounding both devices) commercially manufactured by MOTOROLA Semiconductor Products Inc., and which are fully explained on pages 5-31 to 5-34 of "Semiconductor Data Library", Volume 5/Series B, ©MOTOROLA INC., 1976. The purpose of flip-flops 80 and 82 is to remember the previous conditions of the $\overline{LSB}$ and $\overline{MSB}$ signals and applies this information to the B0 and B1 inputs respectively, of a 4-bit magnitude comparator 84 (unused data input held low) such as the MC 14585B 4-bit Magnitude Comparator also commercially manufactured by MOTOROLA Semiconductor Products Inc., and which is fully explained on pages 5-492 to 5-495 of the above mentioned reference. Also applied to the comparator 84 via inputs A0 and A1 are the present $\overline{LSB}$ and $\overline{MSB}$ signals respectively. In operation, the inputs to comparator 84, which are labeled B0 and B1, are compared against the inputs to comparator 84, which are labeled A0 and A1, and if the present values of $\overline{LSB}$ and $\overline{MSB}$ are less than the previous values obtained from flip-flops 80 and 82, then an output A<B (present values of $\overline{LSB}$ and $\overline{MSB}$ less than previous values of $\overline{LSB}$ and $\overline{MSB}$) is provided on a line 86 or if the current value of $\overline{LSB}$ and $\overline{MSB}$ are greater than the previous values, an output A<B is obtained on a line 88. When an output A<B is obtained on line 88, such output is applied to reset stage 30 as well as to the set inputs of flip-flops 80 and 82. An example to exemplify this action is as follows: assume that the previous $\overline{LSB}$ and $\overline{MSB}$ are such that $B_0=0$, $B_1=1$, and that the present $\overline{LSB}$ and $\overline{MSB}$ are $A_0=0$ and $A_1=0$. With these assumptions the previous inputs infer a 10 or orange condition (see FIG. 3) and the current inputs infer a green condition 00. In other words, load 10 has an accelerating voltage which produces orange light and the coded information is calling for green light to be produced. The comparator 84 senses this condition and an output on line 86 is obtained to effect the change. Alternatively, if the assumed inputs were reversed, an output on line 88 would be provided.

The signal on line 86 (if A < B) is applied to a one-shot multivibrator 90 whose clear input is always held high by virtue of being connected to the source of low voltage A. Once fired, or clocked, the Q and $\overline{Q}$ outputs thereof are independent of further transitions of the input and are a function of external timing components comprising a capacitor 92 and the resistors 94 and 97 serially connected to the source of voltage A. So that these limitations may be made varied, the resistor 94 has been made variable. The Q output of this multivibrator is an enable signal utilized by the control means 18 and is the waveform 163 in FIG. 3. The $\overline{Q}$ output thereof is utilized as the clock input of the already mentioned D flip-flops 80 and 82. Thus, it can be seen that if the previous $\overline{LSB}$ and $\overline{MSB}$ inputs are found to be greater than the current $\overline{LSB}$ and $\overline{MSB}$ inputs, the switching circuit is enabled and the current values of $\overline{LSB}$ or $\overline{MSB}$ are now loaded into flip-flop 82 and 84 to await new information. As previously stated if the current $\overline{LSB}$ and $\overline{MSB}$ signals are greater than the previous, a signal on line 88 is obtained. In accordance with the invention, such case defines that the accelerating voltage is to be lowered. Accordingly, the signal on line 88 is utilized to initiate the recycling of power during the descending change to improve the efficiency of the supply. Additionally, this signal is used to set the flip-flops 80 and 82 after a time delay. This time delay is provided by the capacitor 98 and resistors 100 and 102, resistor 100 being variable to select the time. This delay insures a finite time for recycling energy off the load before setting the flip-flops. A diode 104 is utilized to speed up, shorten, the time that the set signal is applied to the set inputs of the flip-flops. It should also be mentioned that the one-shot multivibrator 90 is preferably a MM74C221 Dual Monostable Multivibrator commercially available from National Semiconductor Corporation and is fully documented in "CMOS DATA-BOOK", ©National Semiconductor Corporation, pages 1-91 to 1-94.

Figure 5:
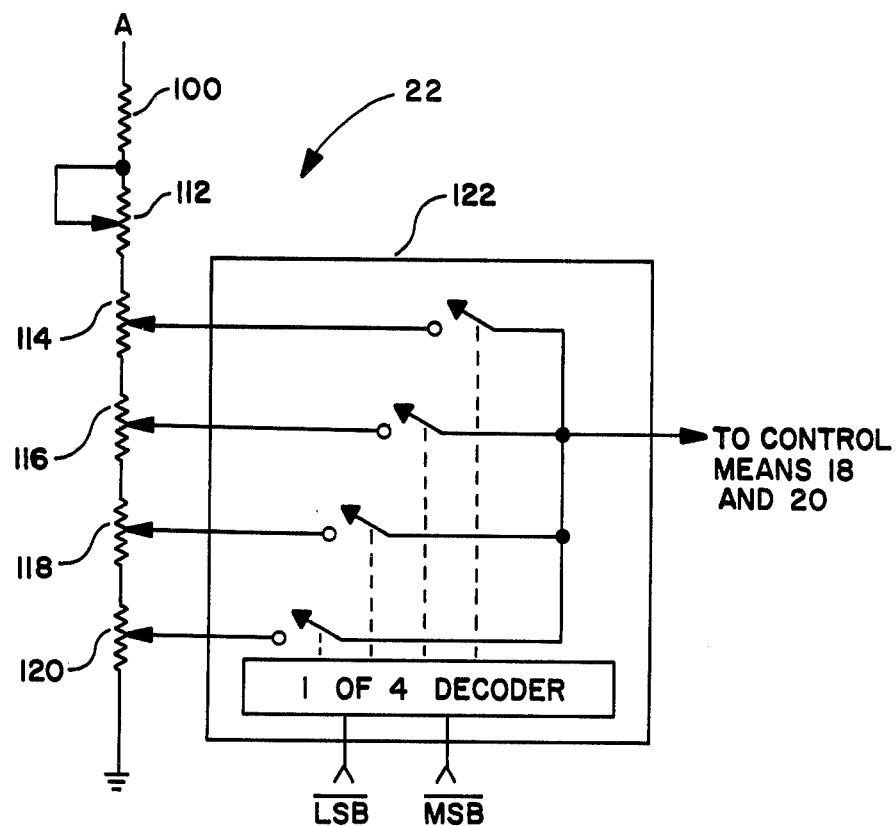
FIG. 5 is a circuit diagram of a circuit useful as the selector stage of the switching circuit shown in FIG. 1.

Referring now to FIG. 5 there is shown the selector stage 22 according to the present invention. Selector stage 22 functions as a 4 channel analog multiplexer whereby four information units (voltages) are derived from a voltage divider network comprising series connected resistors 110, 112, 114, 116, 118 and 120 connected between the source of low voltage A and ground. Variable portions of resistors 114, 116, 118 and 120 are utilized to couple a selectable value of voltage obtained from the divider to the multiplexer. Variable resistor 112 enables the overall maximum value across the divider to be precisely set. The selection of one of the voltages derived across the voltage divider is controlled by the $\overline{LSB}$ and $\overline{MSB}$ signals applied thereto and the selected value is then available to the first and second drive control means. In the embodiment shown, the multiplexer is a CMOS integrated circuit device 122 such as the MC 14052 Dual 4-Channel Analog Multiplexer/Demultiplexer commercially available from MOTOROLA Semiconductor Products Inc. All technical data concerning this device is also published in the mentioned Motorola reference on pages 5-124 to 5-129. A typical output of multiplexer 122 with inputs $\overline{LSB}$ and $\overline{MSB}$ as shown in FIG. 3 would be the waveform 124 also shown in FIG. 3.

Figure 6:
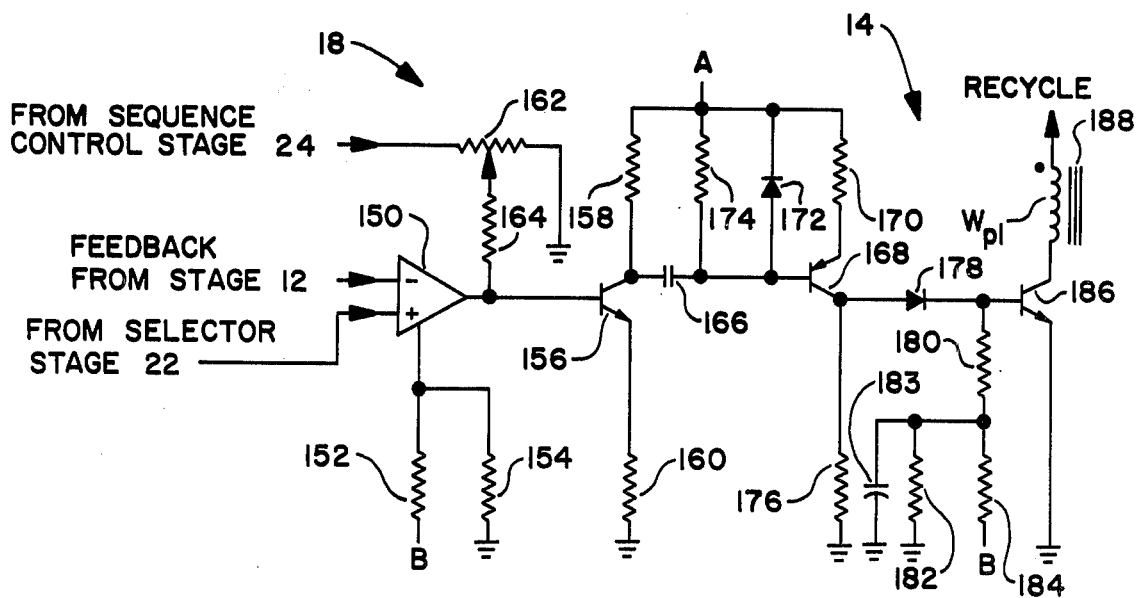
FIG. 6 is a circuit diagram of circuits useful as the first driver control means and the first driver stage of the switching circuit shown in FIG. 1.

Referring now to FIG. 6 there is shown the schematic diagram of the first driver control means 18 and the first driving stage 14. The means 18 comprises the controlled amplifier 150 such as, for example, a National LM311 Voltage Comparator commercially available from National Semiconductor Corp. and described in "Linear Data Book", pages 5-18 to 5-23 copyrighted 1976 by National Semiconductor Corp. having its inverting input adapted to receive feedback from the supply stage 12 and its non-inverting input adapted to receive the multiplexed voltage, waveform 124, from selector stage 22. The amplifier 150 is referenced from a voltage divider comprising the resistors 152 and 154 serially connected between ground and the low voltage source B. The output of amplifier 150 is coupled to the base of an inverting amplifier comprising a NPN transistor 156 whose emitter and collector are coupled to ground and the low voltage source B via resistors 158 and 160, respectively. As previously mentioned, the first driver control stage is enable, such enable signal being applied from the output of one-shot multivibrator 90 (see FIG. 4) via resistors 162 and 164 for controllably enabling the output signal of amplifier 150 to pass through the transistor 156. The enable signal is the waveform 163 (see FIG. 3) and will occur for, say, approximately 25 microseconds. Any signal at the collector of transistor 156 is then coupled by capacitor 166 to the base of yet another transistor amplifier comprising PNP transistor 168.

Transistor 168 has its emitter coupled to low voltage source A via resistor 170, the combination of which forms a current source. Bias for transistor 168 is provided by current via return resistor 174 coupled between the base thereof and the voltage source A. A diode 172 protects the emitter-base junction of transistor 168. Current from this current source is applied to load resistor 176 coupled between the collector of transistor 168 and ground. The signal at the collector of transistor 168 is then applied to the base of a current drive NPN transistor 186 via a diode 178. Transistor 186 has its emitter grounded and its collector coupled to a source of potential, RECYCLE, via the primary winding $W_{p1}$ of a transformer 188. Transistor 186 is preferably a 2N6546 which may require heat sinking, and such transistor also has its base coupled to a voltage divider comprising resistors 182 and 184 via a resistor 180. Resistors 182 and 184 are also coupled between ground and the low voltage source B, respectively. Disposed between a junction formed by the connection of resistors 180, 182 and 184 and ground is a capacitor 183.

In operation, amplifier 150 compares the value of the accelerating voltage available to the load (via feedback) with the value of the selected reference voltage and, in turn, produces a drive pulse to the transistor 156 only during the occurrence of the enable signal 163. This drive pulse, which is not shown in FIG. 3 is similar to signal 163 but which only occurs for about 10 microseconds, is next converted to a current and utilized to drive the primary winding $W_{p1}$ of transformer 188 so that across the secondary winding, a voltage is developed which will be used to provide the necessary value of accelerating voltage. (The "on" time of transistor 186 is generally indicated by the dashed lines 186 in FIG. 3.) In other words, during a portion of the pulse time of waveform 163, transformer 188 is initialized by this circuit. It should be mentioned that capacitor 183 is utilized to "speed-up" the turn off of transistor 186.

Figure 7:
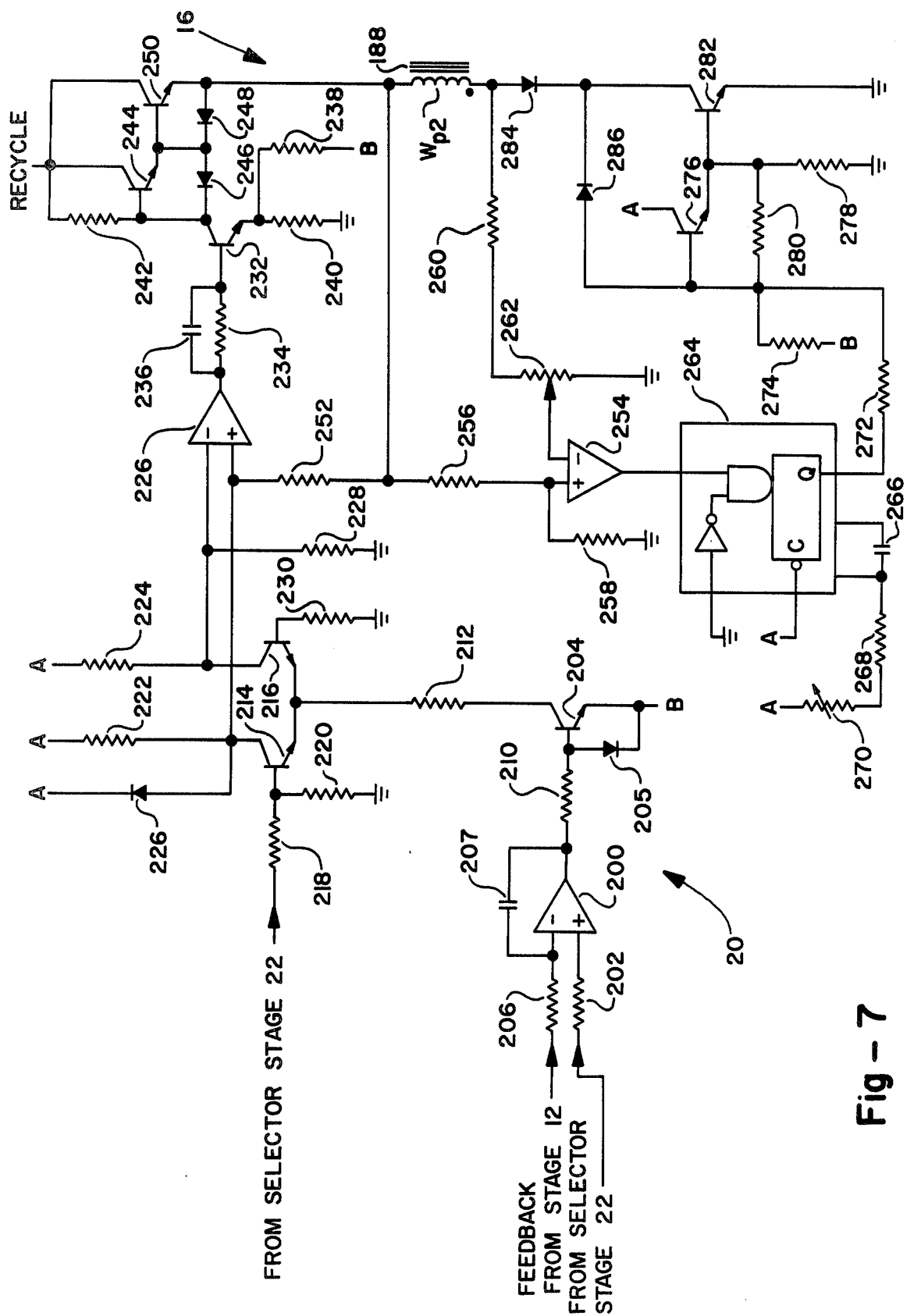
FIG. 7 is a circuit diagram of circuits useful as the second driver control means and the second driver stage of the switching circuit shown in FIG. 1.

In FIG. 7 there is shown the circuits comprising second driving control stage 20 and the second driving stage 16. The waveform 124, (see FIG. 3) obtained from selector stage 22 is applied to the non-inverting input of an amplifier 200 across an input resistor 202 (or additional resistors) whereas the inverting input of this amplifier receives feedback from stage 12 via a resistor 206. Amplifier 200 may be a commercially available National LF356 Operational Amplifier fully described in the mentioned reference by National Semiconductor Corp. on pages 3-1 to 3-13 thereof. The output of amplifier 200 is coupled to a current mirror comprising transistor 204 and a diode 205 via resistor 210 as well as to its inverting input via a capacitor 207. The emitter of transistor 204 is directly coupled to the low voltage source B and its collector supplies current via a resistor 212 to the emitters of an emitter coupled amplifier pair comprising NPN transistors 214 and 216. The base of transistor 214 is coupled to a voltage divider comprising resistors 218 and 220 and has waveform 124 applied to the divider from the selector stage 22. The collectors of transistors 214 and 216 are connected to the low voltage source A via load resistors 222 and 224 as well as to the non-inverting and inverting inputs of an amplifier 226, respectively. Amplifier 226 may be a National LM741 Operational Amplifier which is described on pages 3-191 to 3-193 of the reference data book. The collector of transistor 214 is also connected to the anode of a protection diode 226 having its cathode coupled to the low voltage source A, whereas the collector and base of transistor 216 has resistors 228 and 230 connected to ground, respectively.

The output of amplifier 226 is utilized to drive the base of an NPN transistor 232 via a parallel network comprising a resistor 234 and a capacitor 236. The emitter of transistor 232 is coupled to the low voltage source B via a resistor 238 and to ground via a resistor 240 whereas the collector is coupled to a source of power (RECYCLE) via a load resistor 242. Also coupled to the collector of transistor 232 is the base of an NPN transistor 244 and the cathode of a diode 246, the anode of which is connected to the emitter of transistor 244, the cathode of a diode 248 and the base of 2N6546 current transistor 250. The collectors of transistors 244 and 250 are coupled together and, in turn, coupled to the source of power (RECYCLE). The emitter of transistor 250 is coupled to the anode of the already mentioned diode 248 and to the non-inverting input of amplifier 226 via feedback resistor 252. Additionally, the emitter of transistor 250 is coupled to a second primary winding $W_{p2}$ of the already mentioned transformer 188 and the $W_{p2}$ non-inverting input of an amplifier 254 via a voltage divider comprising resistors 256 and 258.

Amplifier 254 which may be a National LM311 Voltage Comparator, also includes an inverting input which is coupled to the other side of winding $W_{p2}$ via the adjustable voltage divider comprising resistors 260 and 262, the latter being of the adjustable type. The output of amplifier 254 directly connects to a one-shot multivibrator 264. Multivibrator 264 is preferrably the second half of the already mentioned multivibrator 90 and which also includes external timing components comprising the capacitor 266 and resistors 268 and 270 which are referenced to the low voltage source A. The output, Q, of multivibrator 264 is coupled to the low voltage source B via series connected resistors 272 and 274.

Disposed between a junction formed by the connection of resistors 272 and 274 is the base of an NPN transistor follower 276 whose collector is directly coupled to the source of low voltage A and whose emitter is returned to ground via a resistor 278. Also coupled between the emitter of transistor 276 and the mentioned junction is a resistor 280. The emitter of transistor 276 also connects to the base of an NPN transistor 282 whose emitter is grounded and whose collector is coupled to the winding $W_{p2}$ of transformer 188 via the cathode-anode of a diode 284. The circuit is completed by a diode 286 having its cathode coupled to the collector of transistor 282 and its anode connected to the base of transistor 276.

Basically, amplifier 200 and transistors 232, 244 and 250 form a conventional series pass regulator circuit which provides a low impedance DC voltage to the transformer 188. This low impedance DC voltage is then converted to a low impedance AC voltage by aiding the resonant condition of the transformer (already initialized by transistor 186 current as previously mentioned) by a resonate switch comprising the active elements 254, 264 and transistors 276 and 282. The difference pair or multiplier comprising transistors 214 and 216 adjusts the gain of the series pass regulator and the integrator amplifier 200 adjusts the gain (via the multiplier) of the series pass regulator such that the accelerating voltage conforms (ratio wise) with the reference input. Since the integrator is utilized, very precise adjustment is provided thereby minimizing error. Action of this described control and driver stage and the previously described control and drive stage can best be seen in FIG. 3 as the waveform 189. Waveform 189 is, of course, across the secondary winding $W_{s1}$.

Figure 8:
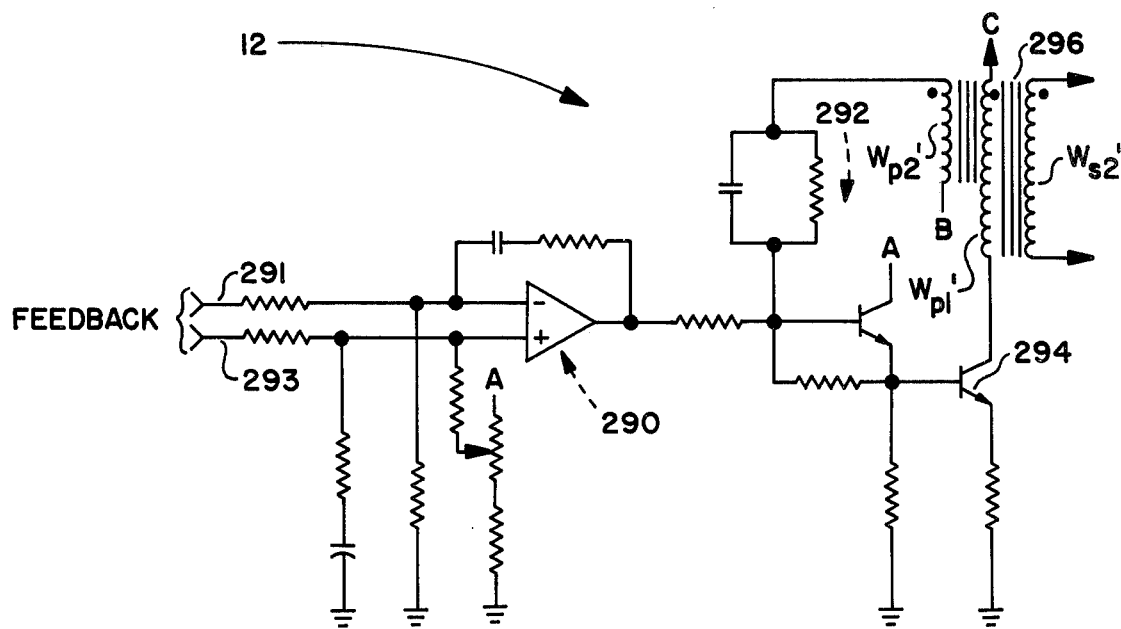
FIG. 8 is a circuit diagram of a portion of the high voltage stage of the switching circuit shown in FIG. 1.

Referring now to FIG. 8, there is shown a portion of the circuit diagram of a conventional high voltage power supply which may be utilized as a portion of stage 12. As is generally the case, feedback from the output stage is applied to an amplifier portion generally indicated by the broken arrow 290. The amplifier 290 controls an oscillator portion indicated by the broken arrow 292 which drives an output stage which is generally a current source such as a transistor 294 providing current to the primary winding $W_{p1}'$ of a transformer 296 having one terminal thereof connected to a higher voltage source C, say of 100 volts. The output is across secondary winding $W_{s2}'$. Of course, the oscillator portion is substained by second primary winding $W_{p2}'$. Since this circuit is conventional, no further discussion thereof is believed necessary. Further information however, is hereby incorporated by reference to "Power Supply Circuits", Circuit Concepts, copyrighted by Tektronix, Inc.

Figure 9:
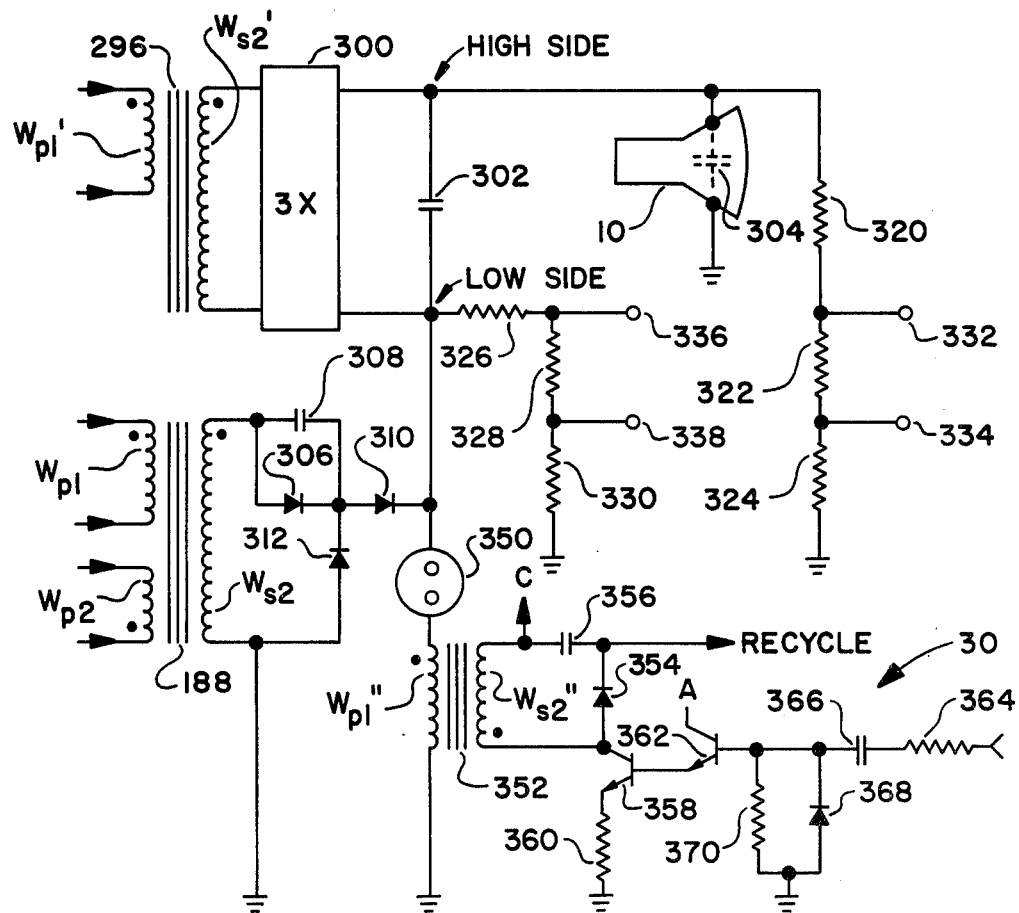
FIG. 9 is a circuit diagram of a portion of the high voltage stage, the load, and the reset stage of the switching circuit shown in FIG. 1.

Referring now to FIG. 9 there is shown another portion of the high voltage power supply, the load 10 such as a cathode-ray tube, and the reset stage. As can be discerned, the secondary winding $W_{s2}'$ of transformer 296 provides to a tripler 300 the necessary power such that tripler 300 produces the electron accelerating voltage to the load 10 after filtering by capacitor 302. Load 10 can, of course, be considered a capacitive load as indicated by the capacitor 304 as is well known. As previously stated, this portion of the supply provides the lowest output level deliverable thereby.

In accordance with the present invention however, windings $W_{p1}$ and $W_{p2}$ of transformer 188 are also driven so that across winding $W_{s2}$ the power necessary to change the accelerating potential on load 10 is provided. One end of winding $W_{s2}$ is connected to voltage doubler, comprising in part a parallel diode 306 and capacitor 308. The cathode of diode 306 is also coupled to the anode of a diode 310 and the cathode of a diode 312, the former diode having its cathode coupled to the low or negative side of the tripler 300 and the latter diode having its anode grounded. This secondary circuit and the high voltage stage are therefore "stacked". Serially disposed between the high or positive side of tripler 300 and ground is a first voltage divider network comprising resistors 320, 322, and 324 and serially disposed between the low side of tripler 300 and ground is a second voltage divider network comprising resistors 326, 328 and 330. It is across these two divider networks that feedback is obtained, and as indicated in the drawing could be across resistors 328 and 322 as indicated by terminals 332, 334, 336 and 338. Although not shown in the drawings, terminals 336 and 338 are preferably the inner conductors of a coaxial cable with terminal 336 connected such that feedback is applied to the input 291 (see FIG. 8) from the divider and input 293 receives feedback from terminal 332. Additionally, input terminal 291 is coupled to the resistor 206 (see FIG. 7). Similarly, the terminal 293 is coupled to the inverting input of amplifier 150 (see FIG. 6). Simultaneously, the terminals 334 and 338 are grounded at the above mentioned inputs whereas the shield of the coaxial cables carrying the feedback are only grounded at the divider terminals. This feedback scheme allows (a) resistors 324 and 330 to act as isolation means in the event of a short across the high voltage section, and (b) since the shield is only grounded at the divider end, less noise generated therein is fed-back.

Also shown in FIG. 9 is the reset section 30 which includes, say, a means 350 such as a "spark gap" serially coupled between the negative, or low, output side of tripler 300 and ground via the primary winding $W_{p1}''$ of a transformer 352. A secondary winding $W_{s2}''$ of transformer 352 has disposed in parallel therewith a series connected diode 354 and a capacitor 356 for providing a rectified voltage, RECYCLE, for use by the first and second driver stages 14 and 16. By recycling this energy, the supply is efficient. Controlling the rectified voltage (RECYCLE) available to the drivers is a control portion including an amplifier comprising an NPN transistor 358 whose emitter is grounded via a resistor 360 and whose collector is directed coupled to winding $W_{s2}''$ and diode 354. The second portion of the amplifier is the NPN transistor 362 whose collector is directly connected to the low voltage source A and whose emitter is directly coupled to the base of transistor 358. Control of the stage is provided by applying the output of multivibrator 90 (see FIG. 4) which is the waveform 93 of FIG. 3 to the base of transistor 362 via the RC network comprising resistors 364 and capacitor 366. Input to the base of transistor 362 is limited by a diode 368 coupled between the base thereof and ground, and such base is returned to ground via a resistor 370.

Before continuing, it should be mentioned that all the transformers i.e., 188, 296 and 352 have "polarity" as indicated by the "dots" adjacent each primary and secondary winding. These dots indicate which one of the two secondary winding terminals is positive at those times when a particular one of the primary winding terminals is positive, and vice versa. It has been shown and described the value of secondary voltage, waveform 189, increases or decreases in accordance with coded information applied at input terminals 26 and 28. On increasing voltage changes, the control and driver stages 18 and 14 causes the secondary of transformer 188 to be initialized. Once initialized, the secondary is maintained by control and driver stages 20 and 16. On descending voltage changes reset stage 30 is triggered which causes energy on load 10 to be utilized by drivers 14 and 16 to increase efficiency of the circuit. Thus, the present invention provides a voltage switching circuit for a color display system which overcomes the disadvantages of the prior art.

Figure 10:
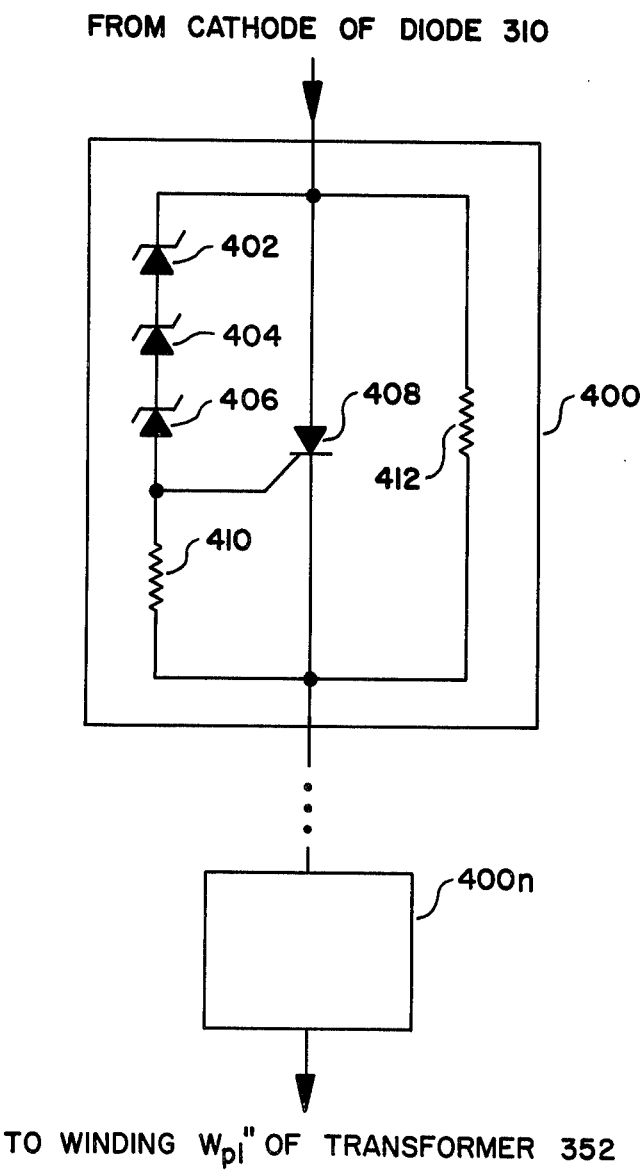
FIG. 10 is a circuit diagram of an alternative portion of the high voltage stage shown in FIG. 9.

While there has been shown and described a preferred embodiment of the present invention, it will be apparent to those skilled in the art that many changes and modifications may be made without departing therefrom in its broader aspects. For example, there is shown in FIG. 10 an alternative circuit which may be utilized in place of the means 350 ("spark gap"). This alternative comprises a plurality of series connected networks 400 . . . 400R, the number of networks dependent upon the necessary electron accelerating voltages required, and each section generally capable of about 500 volts. Each network includes a series connected string of zenor diodes 402, 404 and 406 the latter of which has its anode coupled to the control electrode of an SCR 408 and a resistor 410. The anode of SCR 408 is coupled to the cathode of diode 402 whereas the cathode is coupled to the other end of resistor 410. Disposed in parallel with the above mentioned elements is a resistor 412, the purpose of which is to equalize the voltage drops across the diode 402–406. It should be mentioned that the gate of SCR 408 may be associated with isolated windings of a transformer under the necessary control from the driving stages. Therefore, the appended claims are intended to cover all such changes and modifications as fall within the true spirit and scope of this invention.

The invention is claimed in accordance with the following:

1. Voltage switching display system, comprising:
    a color display device of the type wherein the color of light emitted by a phosphor screen is changed in accordance with an electron accelerating voltage applied thereto;
    a digitally controlled power supply for providing said accelerating voltage, said supply including means for switching and accelerating voltage between different levels; and
    means operatively disposed between said display device and said power supply for causing said accelerating voltage to be re-utilized by said power supply on descending voltage levels.

2. The system according to claim 1 wherein said means for switching comprises:
    a sequence means for providing timing and command signals and including input means for receiving coded information; and
    means responsive to said timing and command signals for providing selected reference signals for controlling said power supply.

3. The system according to claim 2 wherein said means operatively disposed between said display device and said power supply includes means responsive to said command signals for causing said accelerating voltage to be re-utilized by said power supply on descending voltage levels.

* * * * *